United States Patent [19]

Martin, III

[11] 4,167,705

[45] Sep. 11, 1979

[54] CIRCUIT FOR CONTROLLING THE RESPONSE CONDITIONS OF A RADIO RECEIVER

[75] Inventor: Robert J. Martin, III, Lynchburg, Va.

[73] Assignee: General Electric Company, Lynchburg, Va.

[21] Appl. No.: 817,220

[22] Filed: Jul. 20, 1977

[51] Int. Cl.$^2$ .............................................. H04B 1/16
[52] U.S. Cl. ................................... 325/478; 325/402; 179/1 P
[58] Field of Search ............... 325/478, 402, 403, 404, 325/456, 348, 363, 473, 472, 474; 328/165, 162; 307/239, 248, 241; 179/1 VL, 1 P; 340/248 R, 248 E, 248 F

[56] References Cited

U.S. PATENT DOCUMENTS

| 3,252,004 | 5/1966 | Scherr | 307/218 |
| 3,502,900 | 3/1970 | Straub | 307/217 |
| 4,015,206 | 3/1977 | Huntley | 325/402 |
| 4,041,397 | 8/1977 | Bauer et al. | 325/304 |

Primary Examiner—Robert L. Griffin
Assistant Examiner—Tommy P. Chin

Attorney, Agent, or Firm—James J. Williams

[57] ABSTRACT

A plurality of circuits are provided for responding to various conditions in a radio receiver. Each of the circuits produces a first signal in response to the presence of its respective condition and produces a second signal in the absence of its respective condition. Each circuit removably engages a respective receptacle which is arranged to produce the first signal if its circuit is removed. A plurality of first logic gates have their inputs connected to the circuits in a predetermined arrangement. Each first gate produces a third signal in response to all of its inputs having first signals applied thereto, and produces a fourth signal in response to any one of its inputs having a second signal applied thereto. An output logic gate is connected to the first logic gates. The output gate produces an unsquelch signal in response to at least one third signal produced by a first gate, and produces a squelch signal in response to all of the first gates producing fourth signals. A first switch is provided to selectively cause the output gate to produce the unsquelch signal. A second switch is provided to change the conditions needed for the first logic gates to produce the third signals.

8 Claims, 3 Drawing Figures

| LINE | SWITCH SW2 SIGNAL — CHANNEL GUARD OR PAGING S4 | SWITCH SW2 SIGNAL — CHANNEL GUARD & PAGING S4 | CHANNEL GUARD TONE DETECTOR SIGNAL S2 — PRESENT | CHANNEL GUARD TONE DETECTOR SIGNAL S2 — ABSENT | PAGING TONE DETECTOR SIGNAL S3 — PRESENT | PAGING TONE DETECTOR SIGNAL S3 — ABSENT | NOISE SQUELCH SIGNAL S5 — PRESENT | AG1 OUTPUT | AG2 OUTPUT | AG3 OUTPUT | OG1 OUTPUT |
|---|---|---|---|---|---|---|---|---|---|---|---|
| 1 | 1 |   | 1 |   | — |   | — | 0 | — | — | UNSQUELCH |
| 2 | 1 |   | 1 |   |   | 0 | — | 0 | — | 0 | UNSQUELCH |
| 3 | 1 |   |   | 0 | — |   | — | 0 | 0 | — | UNSQUELCH |
| 4 | 1 |   |   | 0 |   | 0 | — | 0 | 0 | 0 | SQUELCH |
| 5 |   | 0 | 1 |   | — |   | — | — | 0 | 0 | UNSQUELCH |
| 6 |   | 0 | 1 |   |   | 0 | — | 0 | 0 | 0 | SQUELCH |
| 7 |   | 0 |   | 0 | — |   | — | 0 | 0 | 0 | SQUELCH |
| 8 |   | 0 |   | 0 |   | 0 | — | 0 | 0 | 0 | SQUELCH |

FIG. 3

CIRCUIT FOR CONTROLLING THE RESPONSE CONDITIONS OF A RADIO RECEIVER

BACKGROUND OF THE INVENTION

My invention relates to a circuit for controlling a radio receiver, and particularly to such a circuit that provides such control in response to several conditions in the radio receiver.

Modern radio receivers are provided with a number of functions to make the receivers more versatile or more useful. For example, a frequency modulation (FM) receiver is provided with a noise squelch circuit which squelches (or blocks the audio of) the reciever until a radio frequency carrier is received so as to keep the user from having to listen to spectrum noise in the absence of received carrier signals. Radio receivers can be provided with a channel guard circuit which blocks the audio until a tone of proper audio frequency is received so that the user does not have to listen to communications intended for other users. Similarly, radio receivers can be provided with a paging circuit which produces a paging signal to alert the user that he is being paged. There are situations where a user may wish to change his receiver from responding to one type of circuit, such as a channel guard circuit, to another type of circuit, such as a paging circuit.

Accordingly, a primary object of my invention is to provide a new and improved circuit for controlling the response conditions of a radio receiver.

Another object of my invention is to provide a new and improved circuit for causing a radio receiver to change its response from one condition or set of conditions to another condition or set of conditions.

Another fairly specific object of my invention is to provide a new and improved circuit for causing a radio receiver to be responsive to a radio frequency carrier and a channel guard signal; or to a radio frequency carrier and a paging signal; or to a radio frequency carrier, a channel guard signal, and a paging signal.

At times, the operability of the radio receiver may have to be checked. Accordingly, another object of my invention is to provide a new and improved circuit for controlling the response conditions of a radio receiver and for checking the operation of the receiver as well.

Previously, changing the control conditions of a radio receiver such as described above required the use of jumpers or wiring changes. Accordingly, another object of my invention is to provide a new and improved circuit for controlling the response conditions of a radio receiver, the response conditions of the control circuit being easily and quickly changed.

When a radio receiver such as described above becomes inoperable for some reason, locating the fault has been a difficult and time consuming job.

Accordingly, another object of my invention is to provide a new and improved circuit that controls the response conditions of a radio receiver, and that can be easily and quickly checked for faults or failures.

Another object of my invention is to provide a new and improved control circuit having condition response circuits that removably engage respective receptacles which produce the proper condition signal to the control circuit upon removal of the condition response circuit, thereby indicating whether the removed condition response circuit was functioning properly.

SUMMARY OF THE INVENTION

Briefly, these and other objects are achieved in accordance with my invention by a plurality of circuits which removably engage respective receptacles. Each circuit produces a first signal in response to the presence of a respective predetermined condition, and produces a second signal in response to the absence of its respective predetermined condition. Each receptacle is arranged to produce the first signal when its circuit is removed. The receptacle outputs are connected to first gating means in a predetermined manner. Each of the first gating means produces third signals when all its predetermined circuits produce first signals, and produce fourth signals when any one of its predetermined circuits produces a second signal. Output gating means are connected to the first gating means to produce an unsquelch signal (that causes operation of the radio receiver) in response to any one third signal. If there are no third signals, the output gating means produce a squelch signal (that blocks operation of the radio receiver). A first switch is connected to the output gating means to selectively cause the output gating means to produce the unsquelch signal when desired. A second switch is connected to the first gating means to selectively change the conditions under which the first gating means can produce the third signals.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

FIG. 3 shows a table for explaining the operation of my control circuit.

DESCRIPTION OF THE PREFERRED EMBODIMENT

Figure 1:
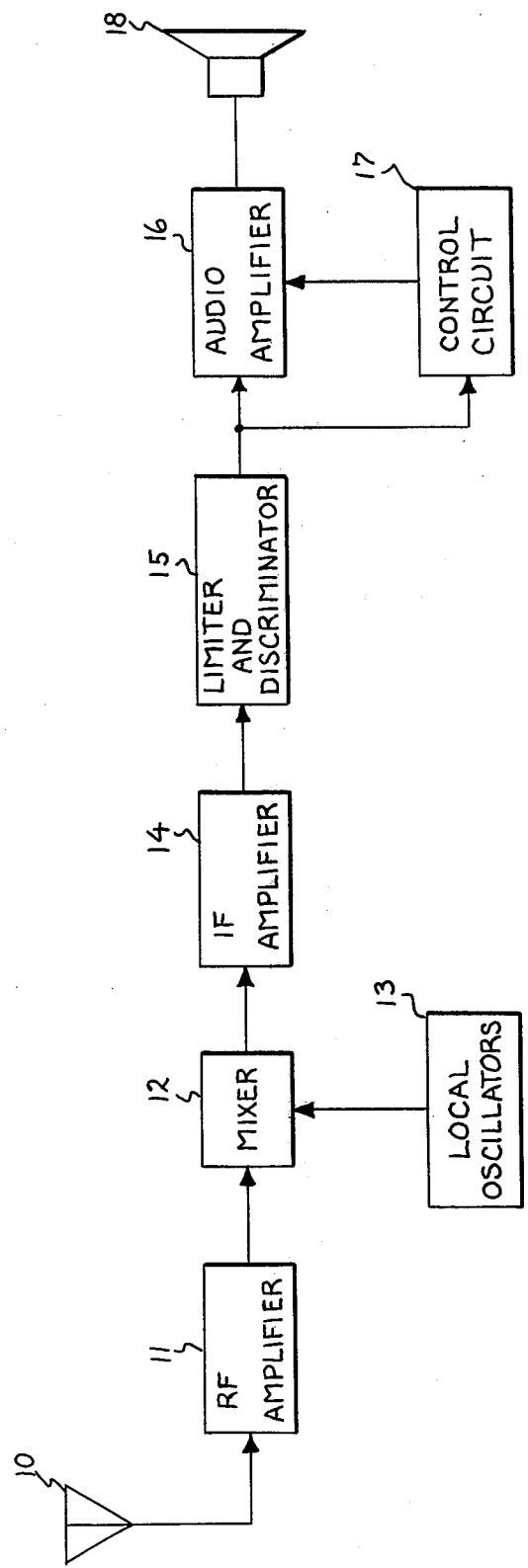
FIG. 1 shows a block diagram of a radio receiver provided with a control circuit in accordance with my invention.

FIG. 1 shows a typical, known frequency modulation (FM) receiver having a control circuit 17 such as provided in accordance with my invention. Such a receiver is provided with an antenna 10 which supplies signals to a radio frequency (RF) amplifier 11. These amplified signals are applied to a mixer 12 which also receives signals from one or more local oscillators 13. The frequency derived from the oscillators 13 determines the frequency of reception of the receiver. The mixed signals, usually a difference frequency, are applied to an intermediate frequency (IF) amplifier 14. The amplified signals are then applied to a limiter and discriminator 15 which produces audible signals. The audible signals are supplied to an amplifier 16 and reproduced by any suitable means such as a loudspeaker 18. The audible signals from the limiter and discriminator 15 are also applied to my control circuit 17. As will be explained in more detail, my control circuit 17 produces a squelch signal which blocks signals passing through the audio amplifier 16; or produces an unsquelch signal which permits audible signals to pass through the audio amplifier 16. Whether a squelch signal or an unsquelch signal is produced by my control circuit 17 depends upon the various conditions in the receiver shown in FIG. 1. While I show an FM type of receiver, my control circuit can be used with other types of receivers, such as amplitude modulation (AM) receivers.

Figure 2:
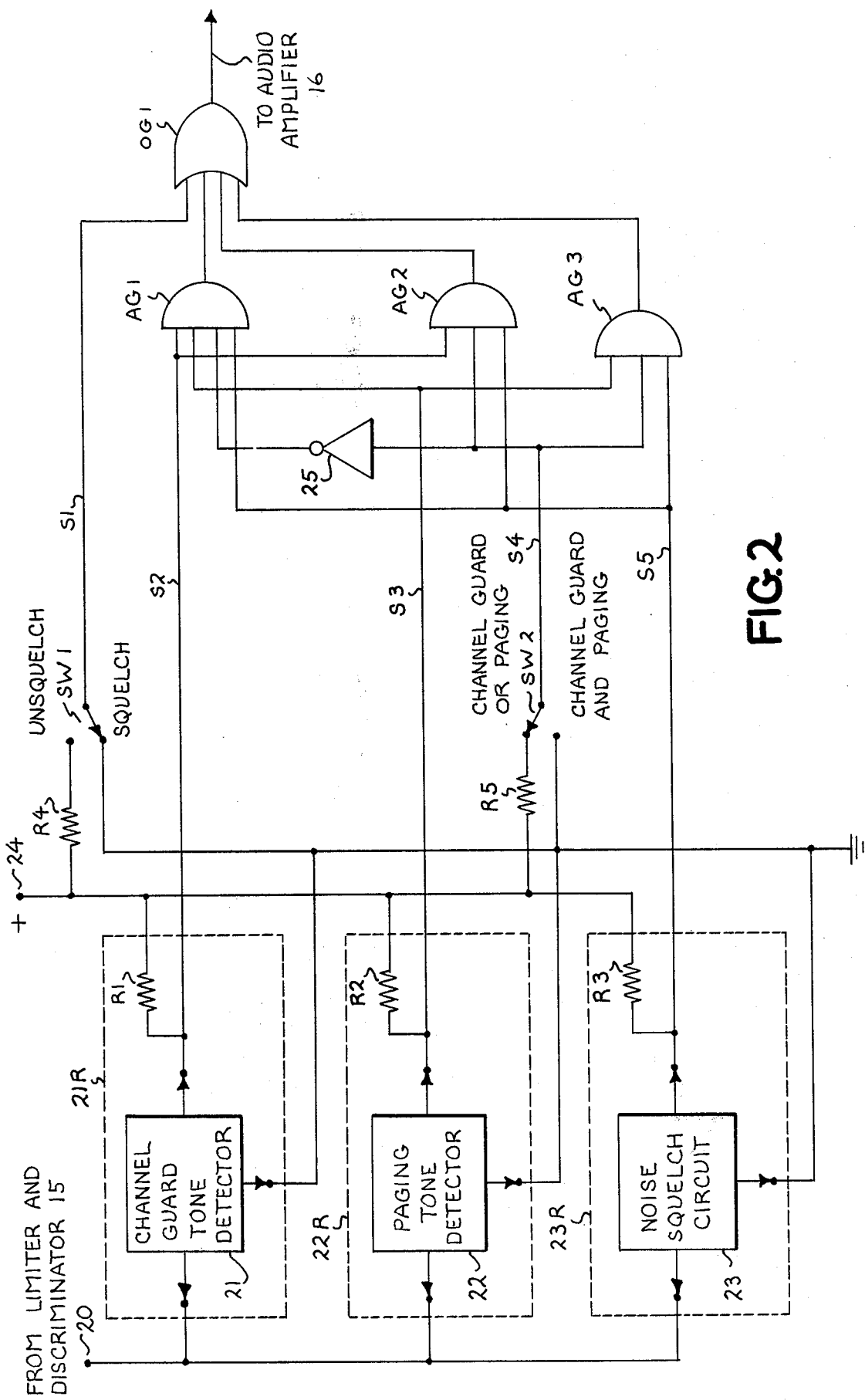
FIG. 2 shows a circuit diagram of the preferred embodiment of my control circuit.

FIG. 2 shows a circuit diagram of the preferred embodiment of my control circuit 17 of FIG. 1. Audible signals from the limiter and discriminator 15 are applied to a terminal 20. These audible signals are applied to a pluarlity of condition responsive circuits 21, 22, 23. These circuits 21, 22, 23 are preferably of a module type which can be plugged into respective receptacles 21R, 22R, 23R (indicated by dashed lines) for easy insertion and removal. The plug in feature of the circuits 21, 22, 23 is indicated by arrows which indicate prongs and by circles which indicate sockets for the prongs. The receptacles 21R, 22R, 23R are provided with respective resistors R1, R2, R3 connected between an output receptacle socket and a source of positive direct current (DC) voltage applied to a terminal 24. This positive voltage causes an output receptacle socket to be at a positive voltage (which I term a logic 1) when the corresponding circuit is removed from the receptacle. The receptacles 21R, 22R, 23R are also provided with a reference or ground so that when a circuit is inserted in its receptacle, a ground or zero volts (which I term a logic 0) is supplied to the output receptacle socket in the absence of a predetermined condition. This can be provided by an output transistor in each circuit which conducts (in the absence of an input signal for the circuit) to pull the positive DC voltage down so that the output is a logic 0. When a proper input signal is received by a circuit, the output transistor would be turned off so that the positive DC voltage remains high at a logic 1.

The circuit 21 is a channel guard tone detector arranged to respond to the presence or absence of a particular audible tone transmitted by the radio frequency carrier, and produce a signal S2 at its output. The frequency of this tone may be below that reproduced by the audio amplifier 16, or may be in the audible frequency band but filtered so that it will not be heard. When this tone is present, the channel guard tone detector causes the signal S2 to be a positive direct current voltage or logic 1. When this tone is absent, the channel guard detector signal S2 is zero volts or logic 0. The circuit 22 is a paging tone detector which is arranged to respond to a paging tone or tones (in any desired sequence or combination), and produce a signal S3 at its output. If this sequence is present, the paging tone detector signal S3 is a positive direct current voltage or logic 1. When this tone or tones are absent, the paging detector signal S3 is zero volts or logic 0. The circuit 23 is a noise squelch circuit which may take the form of a known type of noise squelch circuit, and which produces a signal S5. Typically, such a circuit includes a high pass filter which, if no carrier is present, causes the signal S5 to be zero volts or logic 0. If a carrier is present, the noise squelch circuit causes the signal S5 to be a positive direct current voltage or logic 1.

My circuit comprises a plurality of AND gates AG1, AG2, AG3, which, as known in the art, produce a logic 0 if any one of its inputs is at a logic 0. If all of the inputs are at a logic 1, the AND gate produces a logic 1. I also utilize a four input OR gate OG1 which, as known in the art, produces a logic 1 if any one of its inputs is at a logic 1. The OR gate OG1 produces a logic 0 if all of its inputs are at a logic 0. As will be explained, if any one of the inputs to the OR gate OG1 is at a logic 1, the logic 1 produced by the gate OG1 serves to unsquelch the audio amplifier 16 so that it can pass signals. If all the inputs to the gate OG1 are at a logic 0, the gate OG1 produces a logic 0 or squelch signal that blocks the audio amplifier 16.

The first input of the OR gate OG1 is supplied with a signal S1 from a movable arm of a switch SW1. The switch SW1 has an unsquelch contact connected through a resistor R4 to the terminal 24, and a squelch contact connected to ground or zero volts. When the movable arm of the switch SW1 engages the unsquelch contact, it applies a logic 1 to the gate OG1 which causes the gate OG1 to produce a logic 1 and unsquelch the auido amplifier 16. This switch SW1 is provided for a person to override all of the other condition response circuits to see if the receiver is operating. Normally, a person would keep the movable arm of the switch SW1 engaged with the squelch contact to supply a logic 0.

A switch SW2 is provided with a movable arm which supplies a signal S4 from a channel guard or paging contact connected through a resistor R5 to the positive terminal 24, or from a channel guard and paging contact connected to ground or zero volts. When the movable arm of the switch SW2 is in the position shown to engage the channel guard or paging contact, the signal S4 is a logic 1. When the movable arm of the switch SW2 is moved downward to its channel guard and paging contact, the signal S4 is a logic 0. When the signal S4 is a logic 1, a channel guard tone will open the gate AG2, or a paging tone will open the gate AG3. The logic 1 signal is inverted by a logic inverter 25 to a logic 0 which blocks the gate AG1. When the signal S4 is a logic 0, this blocks the gates AG2, AG3. However, this logic 0 is inverted to a logic 1 by the inverter 25 to open the gate AG1 for both channel guard tone and paging tone being present. Thus, the switch SW2 permits selection of the option requiring either channel guard or paging tone, or requiring both channel guard and paging tone.

The second input of the OR gate OG1 is connected to the output of the four input AND gate AG1. The first input of the AND gate AG1 is connected to the receptacle socket providing the output signal S2 from the channel guard tone detector 21. The second input of the AND gate AG1 is connected to the receptacle socket providing the output signal S3 from the paging tone detector 22. The third input of the AND gate AG1 is connected to the inverter 25 which supplies the logic inversion of the signal S4 from the switch SW2. And the fourth input of the AND gate AG1 is connected to the receptacle socket providing the signal S5 from the noise squelch circuit 23.

The third input of the OR gate OG1 is connected to the output of the three input AND gate AG2. The first input of the AND gate AG2 is connected to the receptacle socket supplying the signal S2 from the channel guard tone detector 21. The second input is connected to the switch SW2 which supplies the signal S4. And the third input is connected to the receptacle socket supplying the signal S5 from the noise squelch circuit 23.

The fourth input of the OR gate OG1 is connected to the output of the three input AND gate AG3. The first input of the AND gate AG3 is connected to the receptacle socket supplying the signal S3 from the paging tone detector 22. The second input is connected to the switch SW2 which supplies the signal S4. And the third input is connected to the receptacle socket supplying the signal S5 from the noise squelch circuit 23.

The operation of the control circuit shown in FIG. 2 will be explained in connection with the table shown in FIG. 3. This operation can be summarized by the following logic equation:

$$\text{Unsquelch} = S1 + S2 \cdot S3 \cdot \overline{S4} \cdot S5 + S2 \cdot S4 \cdot S5 + S3 \cdot S4 \cdot S5 \quad \text{(Equation 1)}$$

In equation 1, the signal for the first term is supplied by the switch SW1, the signals for the second term are supplied to the AND gate AG1, the signals for the third term are supplied to the AND gate AG2, and the signals for the fourth term are supplied to the AND gate AG3. In this explanation, I have assumed that when a radio frequency carrier is received, (either with or without a tone), the noise squelch circuit 23 produces a positive direct current voltage or logic 1. Hence, the signal S5 supplied to the AND gates AG1, AG2, AG3 remains at a logic 1 for this explanation. If no carrier is received or if the circuit 23 does not operate, the signal S5 is a logic 0 which blocks the AND gates AG1, AG2, AG3. I have also assumed that the movable arm of the switch SW1 engages the squelch contact to provide a logic 0 to the OR gate OG1. For the first part of this explanation, I have assumed that the movable arm of the switch SW2 engages the channel guard or paging contact so that the signal S4 is a logic 1 as shown in the first four lines of FIG. 3. This enables the gates AG2, AG3 to produce a logic 1. Since the signal S4 is a logic 1, the inverter 25 changes this to a logic 0 which is applied to the AND gate AG1 for these first four lines. This prevents the gate AG1 from producing a logic 1. In line 1, I have assumed that a channel guard tone is present and a paging tone is present, so that the signals S2 and S3 are logic 1. All inputs to the gates AG2, AG3 are at logic 1 so that both gates AG2, AG3 produce a logic 1. Either of these logic 1's causes the OR gate OG1 to produce a logic 1 or unsquelch signal. In line 2, the paging tone is absent but the channel guard tone is present. The gate AG2 is the only one having its three inputs at a logic 1, so that the gate AG2 is the only gate to produce a logic 1. However, this causes the OR gate OG1 to produce an unsquelch signal. In line 3, the channel guard tone is absent but the paging tone is present. The gate AG3 is the only one having its three inputs at a logic 1, so that only the gate AG3 produces a logic 1 to cause the OR gate OG1 to produce an unsquelch signal. In line 4, with neither channel guard tone nor paging tone present, no gate produces a logic 1, so that the OR gate OG1 produces a squelch signal.

In lines 5 through 8, I have assumed that the arm of the switch SW2 engages the channel guard and paging contact to cause the signal S4 to be logic 0. This logic 0 blocks both AND gates AG2, AG3, so that neither of these gates AG2, AG3 can produce a logic 1. This logic 0 is inverted by the inverter 25 to a logic 1 and supplied to the AND gate AG1. This enables the gate AG1 to produce a logic 1. With a noise squelch signal S5 at logic 1, the gate AG1 can produce a logic 1 only if both a channel guard tone and a paging tone are present. This occurs in line 5, which shows that the AND gate AG1 produces a logic 1. This logic 1 causes the OR gate OG1 to produce an unsquelch signal. In line 6, only a channel guard tone is present so that a squelch signal is produced. In line 7 only a paging tone is present so that the squelch signal is produced. And in line 8 neither channel guard nor paging tone is present so that a squelch signal is produced.

From the above explanation, it will be seen that my control circuit is very useful and versatile in the manufacturing and servicing of a radio receiver. Preferably, a radio receiver would be manufactured with the three receptacles 21R, 22R, 23R wired in the radio. Then those desired circuits can be plugged into their respective receptacles. The receptacles without circuits supply a logic 1 so that the gates operate properly in response to the circuits which are plugged in. This feature makes it possible for a radio to be wired once and the desired functions or features added or changed by the plugging in or removal of circuits. The switches SW1, SW2 (which can take almost any form) can either be inside the radio for a service man to control, or on the outside of the radio for a user to control. After the radio is manufactured, the desired ones of the condition responsive circuits 21, 22, 23 could be inserted or plugged into their respective receptacles 21R, 22R, 23R. This can be done at the factory when a radio is shipped, or can be done by a service man in response to a user's preference or change in preference. The receptacles which are not used produce the proper output (logic 1) so that the remainder of my circuit operates properly. Thus, if only the noise squelch circuit 23 is utilized, the receiver will still be unsquelched for either position of the switch SW2 when a signal is received. If the switch SW2 is in the channel guard or paging position so that the signal S4 is a logic 1, then either gate AG2 or AG3 will supply a logic 1 when a signal is received. If the switch SW2 is in the channel guard and paging position, then the gate AG1 will supply a logic 1 when a signal is received. Persons skilled in the art will appreciate and understand that any combination of the circuits 21, 22, 23 can be used, and the switch SW2 operated for the desired function. Persons skilled in the art will also appreciate that my circuit facilitates and simplifies servicing or repair of a radio. If a radio does not operate, a service man can quickly locate whether the fault is in the control circuit or in the radio. He would first operate the switch SW1 to the unsquelch position which, if the radio operates properly, would unsquelch the audio amplifier 18. If no signal is heard with the audio amplifier 18 unsquelched, then the trouble would likely be in the amplification and demodulation circuits of the radio. If the radio did function for the unsquelch position of the switch SW1, then the service man could selectively remove the circuits 21, 22, 23 individually and in combination until he determined which of the circuits was faulty. This faulty circuit could then be replaced with a good circuit, or if no good circuit was immediately available, the faulty circuit left out so that the radio would function, but without the particular feature provided by the faulty circuit. When a good circuit become available, it could then be placed in the radio to restore it to proper operation.

While I have shown only one embodiment of my invention, persons skilled in the art will appreciate the modifications which can be made. For example, the circuits 21, 22, 23 may be made to be responsive to other conditions besides a channel guard tone, or a paging tone, or a noise squelch signal. This is a matter of preference, although the arrangement shown is one that is typically used in the personal type of radio receiver. More or less receptacles for more or less circuits can also be provided. With more circuits being provided, more switches SW2 could also be provided. Other types of logic gates can be used to achieve the desired functions. The switch SW1 may be omitted, although I prefer that it be included. Likewise, the switch SW2 may be omitted, but the option provided by the switch SW2 is very useful in certain applications where a user must or should be able to make his receiver selectively operable in response to channel guard tone or paging tone, or responsive to both channel guard tone and paging tone. For example, maintenance personnel in a hospital should be able to hear all paging signals being sent to hospital personnel and should also be able to be selectively called by a channel guard signal. However, when such maintenance personnel are off duty, but need to be called, then the switch SW2 can be switched so that both a channel guard tone and a paging tone are required to alert such personnel. However, this is an example only, and persons skilled in the art will appreciate the many alternative combinations that may be made. Therefore, while I have described my invention with reference to only one embodiment, persons skilled in the art will appreciate that modifications may be made without departing from the spirit of the invention or from the scope of the claims.

What I claim and desire to secure by Letters Patent of the United States is:

1. A circuit for controlling the squelch and unsquelch condition of a radio receiver as a function of a plurality of other conditions comprising:
   a. a plurality of circuits for connection to said radio receiver, each of said circuits respectively responding to a predetermined condition in said receiver for producing a first signal in response to said condition in said receiver being present;
   b. a plurality of first gating means each having a plurality of inputs connected to selected ones of said plurality of circuits in a predetermined arrangement, each of said first gating means producing a second signal in response to all its inputs having said first signals applied thereto by said circuits;
   c. second gating means having a plurality of inputs respectively connected to said plurality of first gating means for producing an unsquelch signal in response to the presence of any one of said second signals and for producing a squelch signal in response to the absence of all of said second signals;
   d. and first switch means connected to said second gating means for selectively applying a second signal thereto to cause said second gating means to produce an unsquelch signal.

2. The circuit of claim 1 and further comprising second switch means connected to at least two of said first gating means for selectively enabling one of said two first gating means to produce a second signal and for preventing the other of said two first gating means from producing a second signal in a first condition of said second switch means, and for selectively preventing said one of said two first gating means from producing a second signal and for enabling said other of said two first gating means to produce a second signal in a second condition of said second switch means.

3. The circuit of claim 1 wherein each of said plurality of circuits is removably connected to a respective receptacle, and wherein removal of each of said circuits causes its respective receptacle to produce said first signal.

4. The circuit of claim 1 and further comprising second switch means connected to at least two of said first gating means for selectively enabling one of said two first gating means to produce a second signal and for preventing the other of said two first gating means from producing a second signal in a first condition of said switch means, and for selectively preventing said one of said two first gating means from producing a second signal and for enabling said other of said two first gating means to produce a second signal in a second condition of said second switch means, and wherein each of said plurality of circuits is removably connected to a respective receptacle, and wherein removal of each of said circuits causes its respective receptacle to produce said first signal.

5. A circuit for providing squelch and unsquelch signals for a radio receiver as a function of a plurality of conditions in said receiver comprising:
   a. a plurality of circuit receptacles, each of said receptacles having an input for connection to said radio receiver and an output for producing a first signal in the absence of a response circuit engaging said receptacle;
   b. a plurality of response circuits removably engaging said receptacles, each of said response circuits respectively responding to a predetermined condition in said radio receiver for producing said first signal in response to said condition in said radio receiver being present and for producing a second signal in response to said condition in said radio receiver being absent;
   c. a plurality of first gates connected to said plurality of receptacles in a predetermined arrangement, each of said first gates producing respective third signals in response to the presence of a predetermined combination of said first and second signals produced by said response circuits and producing respective fourth signals in response to the absence of said predetermined combination of said first and second signals produced by said response circuits;
   d. and a second gate connected to said plurality of first gates for producing an unsquelch signal in response to the presence of any one of said third signals and for producing a squelch signal in response to no third signal being present.

6. The circuit of claim 5 and further comprising switch means connected to at least two of said first gates for selectively enabling one of said two gates to produce a third signal and for causing the other of said two gates to produce a fourth signal in a first condition of said switch means, and for selectively causing said one of said two gates to produce a fourth signal and for enabling said other of said two gates to produce a third signal in a second condition of said switch means.

7. A circuit for responding to selected conditions in a radio receiver and producing an unsquelch signal in response to the presence of one or more selected conditions and producing a squelch signal in response to the absence of all of said conditions, said circuit comprising:
   a. first, second, and third receptacles each having a signal input, a signal output, and a logic terminal;
   b. means connected to each of said logic terminals for applying a first logic signal thereto;
   c. means connected to each of said signal outputs of said receptacles for applying a second logic signal thereto; said second logic signal being changed to said first logic signal in response to a circuit connected to said receptacle and the absence of a predetermined signal applied to said signal input of said circuit; and said second logic signal being maintained in response to a circuit being connected to said receptacle and the presence of a predetermined signal applied to said signal input of said circuit;
d. first, second, and third AND gates each having a plurality of inputs and an output, each of said AND gates producing a first logic signal at said output in response to a first logic signal at one or more of said inputs and producing a second logic signal at said output in response to second logic signals at all of said inputs;
e. means connecting a first input of said first and second AND gates to said signal output of said first receptacle;
f. means connecting a second input of said first AND gate and a first input of said third AND gate to said signal output of said second receptacle;
g. means connecting a third input of said first AND gate and second inputs of said second and third AND gates to said signal output of said third receptacle;
h. means connected to said AND gates for selectively causing only said first AND gate to be responsive to input signals or for causing only said second and third AND gates to be responsive to input signals;
i. an OR gate having a plurality of inputs and an output;
j. and means connecting each of said OR gate inputs to a respective output of said AND gates for producing an unsquelch signal in response to any one or more second logic signals produced by said AND gates, and for producing a squelch signal in response to all first logic signals produced by said AND gates.

8. The circuit of claim 7 and further comprising means for selectively applying a first logic signal or a second logic signal to an input of said OR gate.

* * * * *